(12) United States Patent  
Choi et al.

(10) Patent No.: US 9,207,490 B2  
(45) Date of Patent: *Dec. 8, 2015

(54) BACKLIGHT APPARATUS AND DISPLAY APPARATUS INCLUDING THE SAME

(71) Applicant: SAMSUNG ELECTRONICS CO., LTD., Gyeonggi-do (KR)

(72) Inventors: Hoon Choi, Hwaseong-si (KR); Kwang-youn Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 117 days.

This patent is subject to a terminal disclaimer.

(21) Appl. No.: 14/012,560

(22) Filed: Aug. 28, 2013

(65) Prior Publication Data

US 2013/0342788 A1   Dec. 26, 2013

Related U.S. Application Data

(63) Continuation of application No. 12/960,890, filed on Dec. 6, 2010, now Pat. No. 8,562,197.

(30) Foreign Application Priority Data

Jan. 6, 2010   (KR) .................. 10-2010-0000887

(51) Int. Cl.
*F21V 7/04* (2006.01)
*G02F 1/1335* (2006.01)
(Continued)

(52) U.S. Cl.
CPC .......... *G02F 1/133603* (2013.01); *G02B 6/009* (2013.01); *G02B 6/0083* (2013.01); *G09G 3/3406* (2013.01); *H05B 33/0833* (2013.01); *H05K 1/181* (2013.01); *H05K 1/115* (2013.01);
(Continued)

(58) Field of Classification Search
CPC ............................................ H05K 2201/10128
USPC .................................. 362/97.1, 612, 613, 611
See application file for complete search history.

(56) References Cited

U.S. PATENT DOCUMENTS 8,152,354 B2    4/2012  Hong et al.
8,562,197 B2 *  10/2013 Choi et al. .................... 362/612
(Continued)

FOREIGN PATENT DOCUMENTS

CN      101061762 A    10/2007
CN      101271239 A     9/2008
(Continued)

OTHER PUBLICATIONS

Communication dated Oct. 11, 2011 from the European Patent Office in counterpart European application No. 10196370.0.
(Continued)

*Primary Examiner* — Ali Alavi
(74) *Attorney, Agent, or Firm* — Sughrue Mion, PLLC

(57) ABSTRACT

A backlight apparatus includes a substrate which includes a plurality of layers. A plurality of light emitting modules are arranged on a top layer of the plurality of layers closest to a light guide panel, and a plurality of wires penetrates through the plurality of layers to electrically connect the light emitting modules and a plurality of driving units. Accordingly, the width of the substrate of an edge type backlight apparatus which can provide local dimming is reduced. Therefore, the display apparatus using the edge type backlight apparatus can be slim even if it is designed to provide local dimming.

22 Claims, 17 Drawing Sheets

(51) Int. Cl.
*F21V 8/00* (2006.01)
*G09G 3/34* (2006.01)
*H05K 1/18* (2006.01)
*H05B 33/08* (2006.01)
*H05K 1/11* (2006.01)

(52) U.S. Cl.
CPC ............... *H05K 2201/0397* (2013.01); *H05K 2201/10106* (2013.01); *H05K 2201/10189* (2013.01)

(56) References Cited

U.S. PATENT DOCUMENTS

| | | | |
|---|---|---|---|
| 8,905,610 B2 * | 12/2014 | Coleman et al. | 362/554 |
| 2008/0047743 A1 * | 2/2008 | Komatsu et al. | 174/260 |
| 2009/0168456 A1 * | 7/2009 | Park et al. | 362/613 |
| 2009/0185362 A1 * | 7/2009 | Hong et al. | 362/97.1 |
| 2009/0308639 A1 * | 12/2009 | Chung | 174/254 |
| 2010/0149834 A1 * | 6/2010 | Kim et al. | 362/612 |
| 2013/0027622 A1 * | 1/2013 | Ishitani et al. | 349/42 |
| 2013/0094187 A1 * | 4/2013 | Kamada | 362/97.3 |

FOREIGN PATENT DOCUMENTS

| | | |
|---|---|---|
| JP | 2006119268 A | 5/2006 |
| KR | 10-2008-0039637 A | 5/2008 |
| KR | 1020090079568 A | 7/2009 |

OTHER PUBLICATIONS

Communication, dated Jul. 25, 2013, issued by the European Patent Office in counterpart European Patent Application No. 10196370.0.
Communication dated Dec. 1, 2014 issued by the European Patent Office in counterpart European Application No. 10 196 370.0.
Communication dated Dec. 31, 2014 issued by the State Intellectual Property Office of P.R. China in counterpart Chinese Application No. 201110001857.1.
Communication dated May 6, 2014 issued by the Chinese Patent Office in counterpart Chinese Patent Application No. 201110001857.1.
Communication dated Jul. 3, 2015 issued by the State Intellectual Property Office of the People's Republic of China in counterpart Chinese Patent Application No. 201110001857.1.
Communication dated Oct. 8. 2015, issued by the Korean Intellectual Property Office in counterpart Korean Application No. 10-2010-0000887.

* cited by examiner

BACKLIGHT APPARATUS AND DISPLAY APPARATUS INCLUDING THE SAME

CROSS-REFERENCE TO RELATED APPLICATION

This application is a Continuation Application of U.S. application Ser. No. 12/960,890 filed Dec. 6, 2010 which claims priority from Korean Patent Application No. 10-2010-0000887, filed on Jan. 6, 2010, in the Korean Intellectual Property Office, the disclosures of which are incorporated herein by reference in their entirety.

BACKGROUND

1. Field

Apparatuses consistent with exemplary embodiments relate to a backlight apparatus and a display apparatus including the same, and more particularly, to a backlight apparatus which is of an edge type and provides a backlight capable of providing local dimming, and a display apparatus including the same.

2. Description of the Related Art

A liquid crystal display (LCD) panel of an LCD apparatus cannot emit light by itself, and therefore requires a backlight apparatus to emit light toward the LCD panel.

The backlight apparatus is classified into a direct type and an edge type according to where light emitting elements are located. The direct type backlight apparatus has light emitting elements uniformly arranged on an entire rear surface of an LCD panel so that the light emitting elements directly emit light toward the LCD panel. On the other hand, the edge type backlight apparatus has light emitting elements arranged along only one or more edges of an LCD panel and reflects light emitted from sides toward a rear surface of the LCD panel using a light guide plate.

The direct type backlight apparatus has a greater thickness than the edge type backlight unit because the light emitting elements are arranged on the rear surface of the LCD panel in the direct type backlight apparatus while the light emitting elements are arranged along only the edge of the LCD in the edge type backlight apparatus.

Consumers desire to use a slim display apparatus. Therefore, there is a demand for a display apparatus using an edge type backlight apparatus and also providing local dimming.

SUMMARY

Exemplary embodiments overcome the above disadvantages and other disadvantages not described above. However, it is understood that an exemplary embodiment concept is not required to overcome the disadvantages described above, and an exemplary embodiment may not overcome any of the problems described above.

Exemplary embodiments provide a backlight apparatus which is of an edge type and also provides a backlight capable of providing local dimming, and a display apparatus including the same.

According to an aspect of an exemplary embodiment, there is provided a display apparatus including: a display panel, and a backlight unit which provides light to the display panel. The backlight unit includes: a plurality of light emitting modules, a driving unit which drives the plurality of light emitting modules, a substrate which includes a plurality of layers, wherein the light emitting modules are arranged on a top layer of the plurality of layers, and a plurality of wires penetrate through the plurality of layers to electrically connect the plurality of light emitting modules and the driving unit, and a chassis which accommodates the light emitting modules and the substrate at an end of the display panel.

The backlight unit may include a plurality of light emitting blocks each including at least one of the plurality of light emitting modules, and at least one wire may be arranged in each layer of the substrate and connected to at least one light emitting block.

All of the light emitting modules included in each one of the light emitting blocks may be connected to a same wire.

A number of the layers of the substrate may be equal to a number of the light emitting blocks.

The at least one driving unit may be a plurality of driving units, and a number of the driving units may be equal to a number of the light emitting blocks to respectively drive the light emitting blocks.

The backlight unit may include a plurality of light emitting blocks each including at least one of the plurality of light emitting modules, and the at least one driving unit may be a plurality of driving units and a number of the light emitting blocks may correspond to a number of the driving units, and a number of the layers may be less than or equal to the number of the driving units.

The plurality of layers of the substrate may be connected to each other through at least one via hole.

The plurality of driving units may drive the light emitting modules at different brightness levels.

The plurality of light emitting modules may each include at least one light emitting diode (LED), and the light emitting modules may be disposed along an edge of the chassis at the end of the display panel.

According to an aspect of another exemplary embodiment, there is provided a backlight apparatus including: a plurality of light emitting modules, a driving unit which independently drives the plurality of light emitting modules, a substrate which includes a plurality of layers, wherein the light emitting modules are arranged on a top layer of the plurality of layers, and a plurality of wires penetrate through the plurality of layers to electrically connect the plurality of light emitting modules and the at least one driving unit, and a chassis which accommodates the light emitting modules and the substrate at an end of a display panel.

The backlight unit may further include a plurality of light emitting blocks each including at least one of the plurality of light emitting modules, and at least one wire may be arranged in each layer of the substrate and connected to at least one light emitting block.

All of the light emitting modules included in each one of the light emitting blocks may be connected to a same wire.

A number of the layers of the substrate may correspond to A number of the light emitting blocks.

The at least one driving unit may be a plurality of driving units, and a number of the driving units may be equal to a number of the light emitting blocks to respectively drive the light emitting blocks.

The backlight unit may further include a plurality of light emitting blocks each including at least one of the plurality of light emitting modules, and a number of the light emitting blocks may correspond to a number of the driving units, and a number of the layers may be less than or equal to the number of the driving units.

The plurality of layers of the substrate may be connected to each other through at least one via hole.

The plurality of driving units may drive the light emitting modules at different brightness levels.

The plurality of light emitting modules each include at least one light emitting diode (LED), and the light emitting modules are disposed along an edge of the chassis.

Additional aspects and advantages will be set forth in the detailed description, will be obvious from the detailed description, or may be learned by practicing the exemplary embodiments.

BRIEF DESCRIPTION OF THE DRAWINGS

The above and/or other aspects will be more apparent by describing in detail exemplary embodiments, with reference to the accompanying drawings in which.

DETAILED DESCRIPTION OF THE EXEMPLARY EMBODIMENTS

Figure 1:
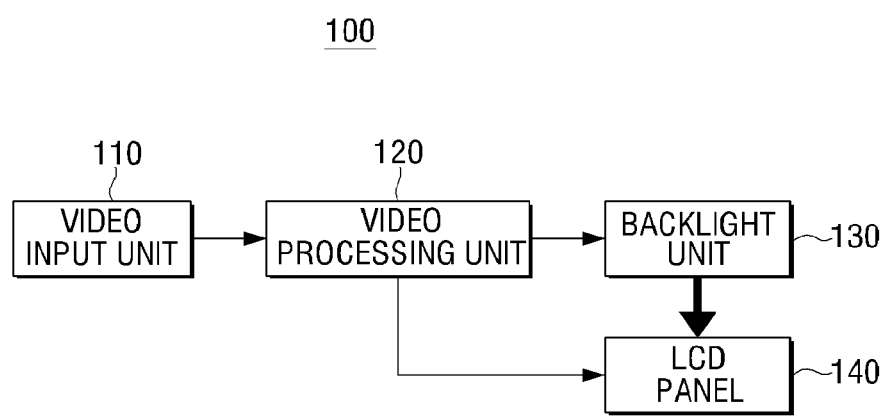
FIG. 1 is a block diagram illustrating an LCD apparatus according to an exemplary embodiment.

Hereinafter, exemplary embodiments will be described in greater detail with reference to the accompanying drawings.

In the following description, same reference numerals are used for the same elements when they are depicted in different drawings. The matters defined in the description, such as detailed construction and elements, are provided to assist in a comprehensive understanding of the exemplary embodiments. Thus, it is apparent that the exemplary embodiments can be carried out without those specifically defined matters. Also, functions or elements known in the related art are not described in detail since they would obscure the exemplary embodiment with unnecessary detail.

FIG. 1 is a block diagram illustrating an LCD apparatus 100 according to an exemplary embodiment. As shown in FIG. 1, the LCD apparatus 100 includes a video input unit 110, a video processing unit 120, a backlight unit 130, and an LCD panel 140.

The video input unit 110 receives a video from a broadcasting station, a cable or an external apparatus. For example, the video input unit 110 may be a tuner that receives broadcast signals through air or a cable, or may be an interface that is connected to an external apparatus or to an external system to receive a video. The video input unit 110 transmits the input video to the video processing unit 120.

The video processing unit 120 converts the input video to a video signal of a format which is suitable for the LCD panel 140, and transmits the video signal to the LCD panel 140. Also, the video processing unit 120 generates a brightness control signal for local dimming of the backlight unit 130 and transmits the brightness control signal to the backlight unit 130.

The backlight unit 130 receives the brightness control signal from the video processing unit 120, and drives a light emitting unit 210 to emit backlight toward the LCD panel 140. The backlight unit 130 may be a light emitting diode (LED) backlight of an edge type. The edge type LED backlight, as used herein, refers to a backlight unit 130 that has a light emitting unit 210 disposed along an edge of the backlight unit 130. In the exemplary embodiments, the light emitting unit 210 is disposed along an edge of a bottom chassis at a lower end of the LCD panel 140.

The LCD panel 140 adjusts the permeability of backlight generated by the backlight unit 130 to visualize the video signal and displays the input video on a screen. The LCD panel 140 includes two substrates on which electrodes are arranged and which face each other, and is formed by injecting a liquid crystal material between the two substrates. If voltage is applied to the two substrates, an electric field is generated to move molecules of the liquid crystal material injected between the two substrates such that the permeability of the backlight of the LCD panel 140 is adjusted.

Hereinafter, the backlight unit 130, which is a backlight apparatus, will be explained in detail with reference to FIGS. 2A to 2C.

Figure 2A:
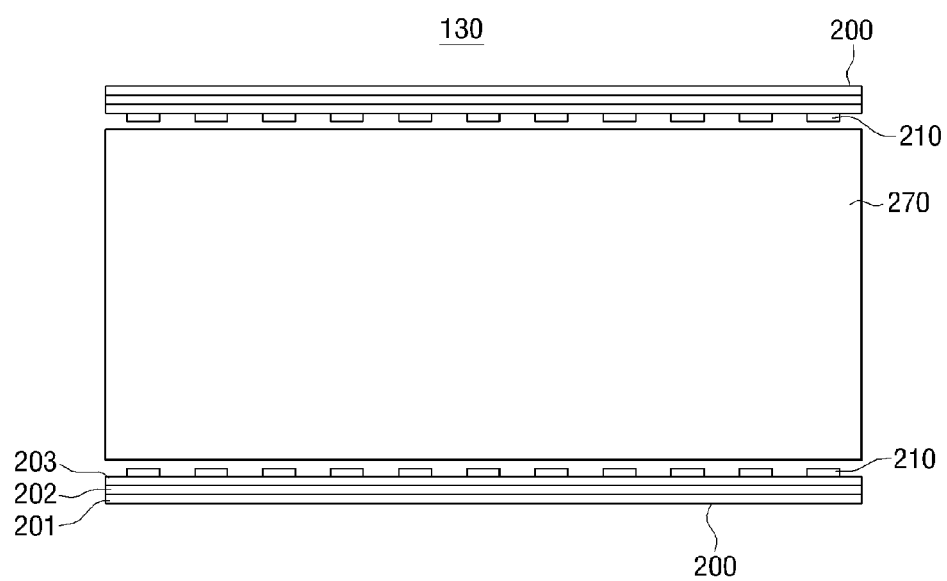
FIG. 2A is an elevation view illustrating an edge type backlight apparatus according to an exemplary embodiment.
Figure 2B:
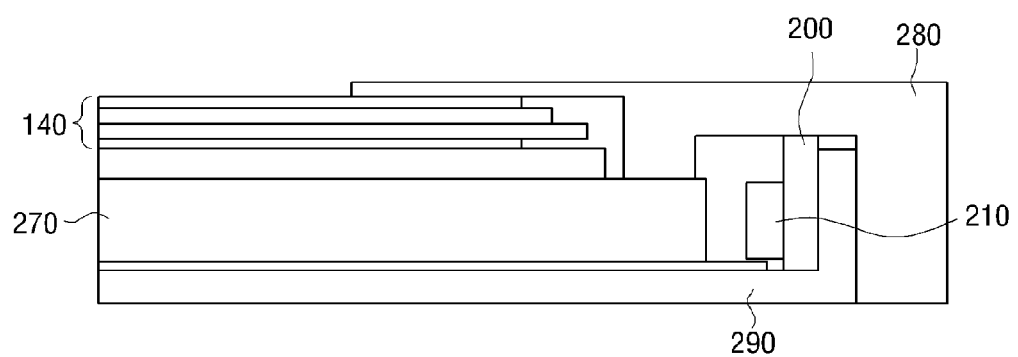
FIG. 2B is a side view of the edge type backlight apparatus of FIG. 2A.
Figure 2C:
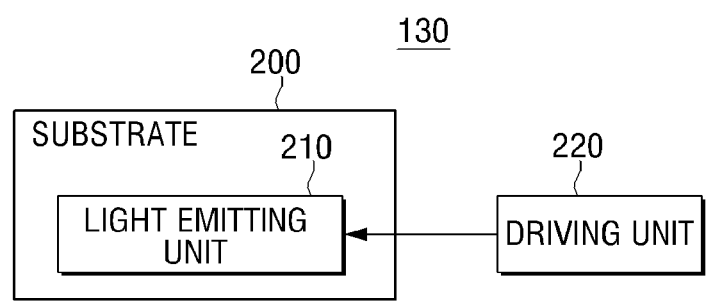
FIG. 2C is a block diagram illustrating the edge type backlight apparatus of FIG. 2A.

As shown in FIGS. 2A to 2C, the backlight unit 130 includes a substrate 200, a light emitting unit 210, a driving unit 220, and a light guide plate 270.

FIG. 2A is an elevation view illustrating an edge type backlight unit 130 according to an exemplary embodiment. As shown in FIG. 2A, in the edge type backlight unit 130, the substrate 200 on which the light emitting unit 210 is arranged is disposed on an upper surface and a lower surface of the light guide plate 270. The light guide plate 270 serves to uniformly transmit backlight emitted from the light emitting unit 210 toward the LCD panel 140. More specifically, the backlight emitted from the light emitting unit 210 enters and diffuses in the light guide plate 270 and is reflected toward the LCD panel 140.

FIG. 2B is a side view of the edge type backlight unit 130. As shown in FIG. 2B, the light emitting unit 210 is arranged on the surface of the substrate 200, facing the light guide plate 270. The LCD panel 140 is located on the top surface of the light guide plate 270 perpendicular to the surface of the light guide plate 270 which faces the light emitting unit 210. The light emitting unit 210 irradiates backlight to the side surface of the light guide plate 270. The backlight is guided to the LCD panel 140 by the light guide plate 270. Also, the light guide plate 270 and the LCD panel 140 are supported by a front cover 280.

Also, a bottom chassis 290 is provided under the LCD panel 140 to accommodate the light emitting unit 210 and the substrate 200. That is, the bottom chassis 290 supports the LCD panel 140 and the substrate 200 on which the light emitting unit 210 is arranged.

FIG. 2C is a block diagram illustrating the edge type backlight unit 130 according to an exemplary embodiment.

The light emitting unit 210 and a plurality of wires 310, 320, 330 to electrically connect the light emitting unit 210 to the driving unit 220 are arranged on the substrate 200. The substrate 200 includes a plurality of layers 201, 202, 203 and the light emitting unit 210 is arranged on a top layer 201 closest to the light guide plate 270. A connector may be disposed on the top layer 201 to be connected to the driving unit 220. The top layer 201 and the lower layers 202, 203 are connected to each other through via holes 323, 326, 333, 336. The lower layers 202, 203 each has at least one wire 320, 330 arranged to communicate with at least one of the via holes 323, 326, 333, 336 to connect the light emitting unit 210 and the driving unit 220.

Figure 3A:
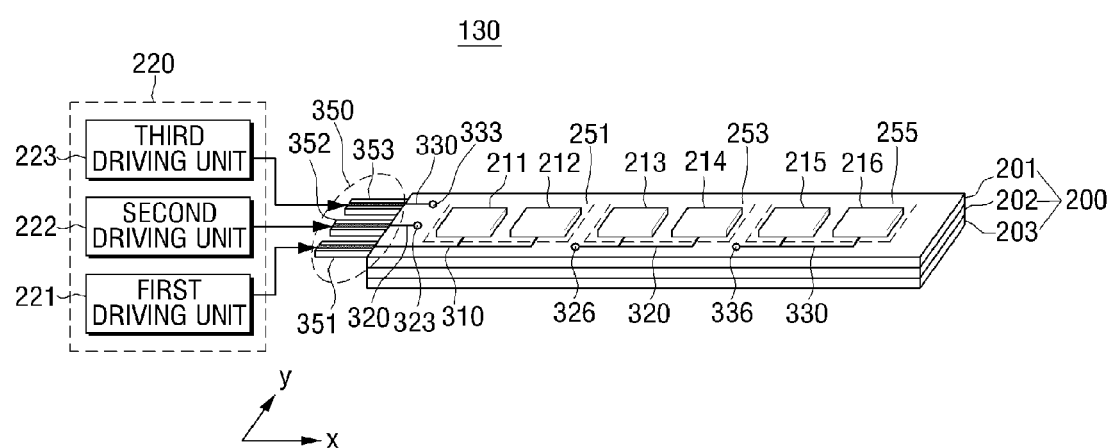
FIG. 3A is a perspective view illustrating an edge type backlight apparatus using a three-layered substrate according to an exemplary embodiment.
Figure 3B:
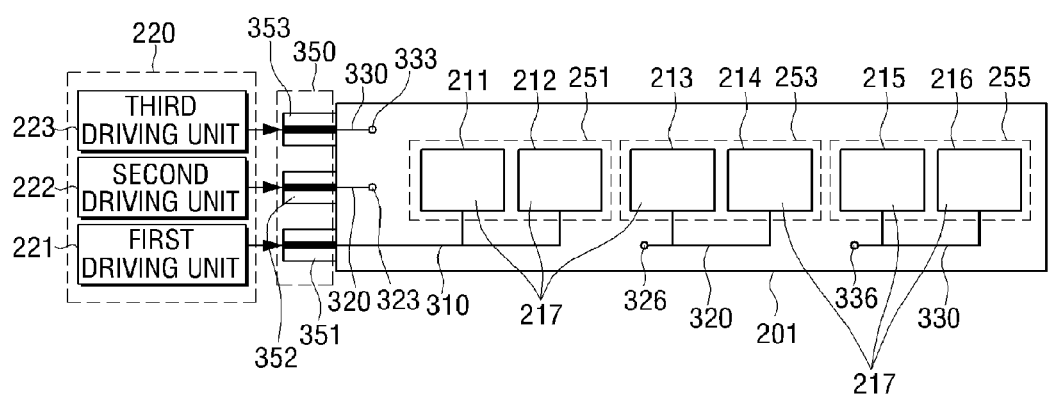
FIG. 3B is a view illustrating the first layer of the three-layered substrate of FIG. 3A.

The light emitting unit 210 includes a plurality of light emitting modules 211-216 each including at least one light emitting element 217 to emit backlight, as shown in FIG. 3B. That is, one light emitting module 211-216 includes at least one light emitting element 217 and is a unit to emit light. The light emitting element 217 may be a light emitting diode (LED) or may be any other light source.

The light emitting unit 210 may include a plurality of light emitting blocks 251, 253, 255 each including at least one light emitting module 211-216. That is, one light emitting block 251, 253, 255 includes at least one light emitting module 211-216. The light emitting block 251, 253, 255 is an area unit which is used to control whether or not to emit light in providing local dimming. One light emitting block 251, 253, 255 is driven by one driving unit 220 such that the light emitting blocks 251, 253, 255 are driven independently.

For example, if there are three light emitting blocks 251, 253, 255, the light emitting unit 210 controls backlight such that three areas corresponding to the three light emitting blocks 251, 253, 255 have different brightness values. Therefore, three driving units 220 are required. That is, if three light emitting blocks 251, 253, 255 are provided, the light emitting unit 210 provides local dimming with respect to the three areas.

Also, the at least one light emitting module 211-216 included in one light emitting block 251, 253, 255 of the light emitting unit 210 is connected to wires 310 which are arranged in the same layer 201 of the plurality of layers 201, 202, 203. Since the light emitting modules 211-216 of one light emitting block 251, 253, 255 are driven concurrently, all of the light emitting modules 211-216 of the one of the light emitting blocks 251, 253, 255 are connected to one driving unit 220.

The plurality of light emitting modules 211-216 and the plurality of light emitting blocks 251, 253, 255 of the light emitting unit 210 will be described in detail below with reference to FIG. 3A.

The driving unit 220 drives the plurality of light emitting modules 211-216 included in the light emitting unit 210. More specifically, the driving unit 220 generates a driving signal to drive the light emitting unit 210 and outputs it to the light emitting unit 210.

A plurality of driving units 220 drive different light emitting modules 211-216 to provide local dimming. The plurality of light emitting blocks 251, 253, 255 are independently driven and the number of driving units 220 is the same as the number of the light emitting blocks 251, 253, 255. The plurality of driving units 220 drive the different light emitting modules 211-216 at different brightness levels in order to provide local dimming.

Also, the number of driving units 220 may be the same as the number of light emitting blocks 251, 253, 255 and the number of layers 201, 202, 203 of the substrate 200. In this case, one wire 310, 320, or 330 is arranged in each layer of the plurality of layers 201, 202, or 203 to connect one of the light emitting blocks 251, 253, or 255 to one driving unit 220. This case is illustrated in FIGS. 3A to 3D.

As described above, the number of driving units 220 may correspond to the number of light emitting blocks 251, 253, 255.

However, one driving unit 220 may drive the plurality of light emitting blocks 251, 253, 255. In this case, the plurality of light emitting blocks 251, 253, 255 are driven together by one driving unit 220. In this exemplary embodiment, the total number of driving units 220 is less than the total number of light emitting blocks 251, 253, 255.

Figure 4A:
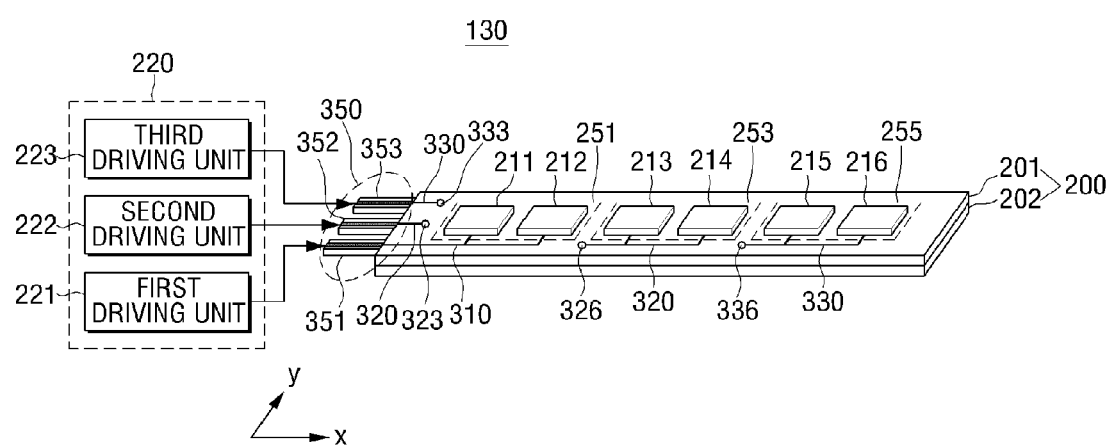
FIG. 4A is a perspective view illustrating an edge type backlight apparatus using a two-layered substrate according to another exemplary embodiment.
Figure 4B:
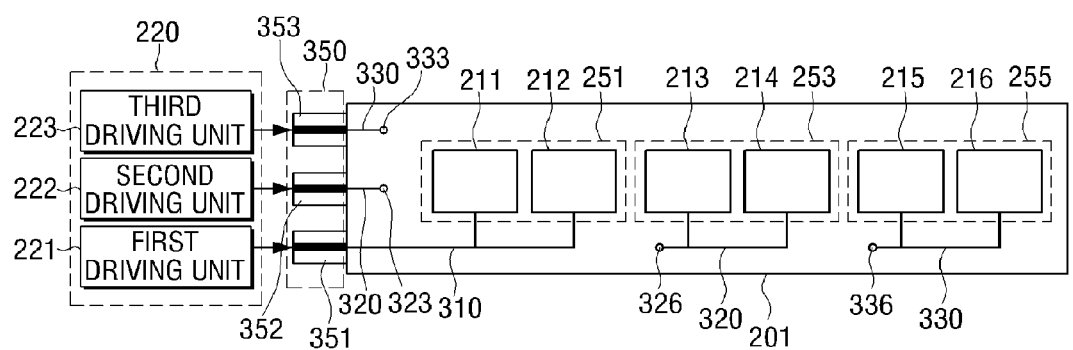
FIG. 4B is view illustrating the first layer of the two-layered substrate of FIG. 4A.
Figure 4C:
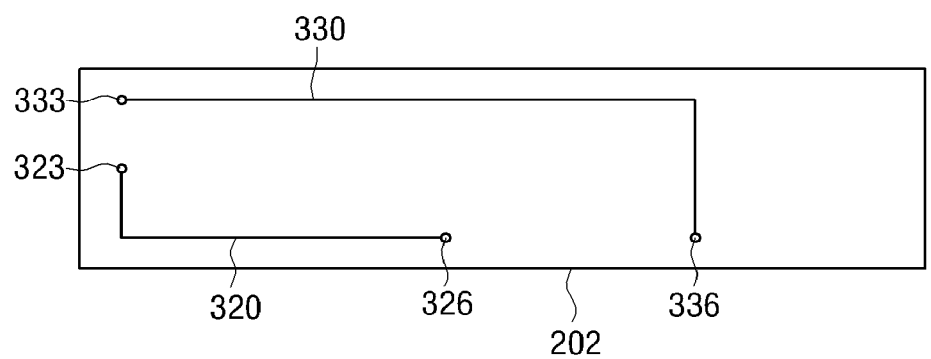
FIG. 4C is a view illustrating the second layer of the two-layered substrate of FIG. 4A.

Also, the number of driving units 220 may be the same as the number of light emitting blocks 251, 253, 255 and the number of layers 201, 202, 203 of the substrate 220 may be less than the number of driving units 220. In this case, a plurality of wires 320, 330 may be arranged in one layer 202. This case is illustrated in FIGS. 4A to 4C.

As described above, the plurality of driving units 220 are connected to the plurality of light emitting blocks 251, 253, 255 using the multi-layered substrate 200 so that the substrate 220 can have a reduced width. Accordingly, the edge type backlight apparatus can be slim even if it supports local dimming.

Hereinafter, a backlight unit 130 having a three-layered substrate 200, a light emitting unit 210 including three light emitting blocks 251, 253, 255, and three driving units 220 will be explained with reference to FIGS. 3A to 3D.

FIG. 3A is a perspective view illustrating an edge type backlight apparatus using a three-layered substrate 200 according to an exemplary embodiment. FIG. 3B is a view illustrating a first layer 201 of the three-layered substrate 200 of FIG. 3A.

As shown in FIG. 3A, the backlight apparatus or the backlight unit 130 includes a three-layered substrate 200, a light emitting unit 210 having three light emitting blocks, and three driving units 220.

More specifically, the substrate 200 consists of a first layer 201, a second layer 202, and a third layer 203. The first layer 201, which is the top layer of the substrate 200 closest to the light guide plate 270, has six light emitting modules 211-216 arranged thereon.

The light emitting unit 210 includes the six light emitting modules 211-216. The first light emitting module 211 and the second light emitting module 212 form a first light emitting block 251, the third light emitting module 213 and the fourth light emitting module 214 form a second light emitting block 253, and the fifth light emitting module 215 and the sixth light emitting module 216 form a third light emitting block 255.

The driving unit 220 includes a first driving unit 221, a second driving unit 222, and a third driving unit 223. The first driving unit 221 drives the first light emitting block 251, the second driving unit 222 drives the second light emitting block 253, and the third driving unit 223 drives the third light emitting block 255.

As shown in FIG. 3B, a connector 350 is disposed on the first layer 201 of the substrate 200 to be connected to the driving unit 220. More specifically, the connector 350 includes a first connector 351, a second connector 352, and a third connector 353. The first connector 351 connects the first driving unit 221 to the first light emitting block 251, the second connector 352 connects the second driving unit 222 to the second light emitting block 253, and the third connector 353 connects the third driving unit 223 to the third light emitting block 255.

The connector 350 is connected to the light emitting blocks 251, 253, 255 through wires 310, 320, 330 and via holes 323, 326, 333, 336 which are disposed in the substrate 200. The connector 350 includes a first connector 351, a second connector 352, and a third connector 353.

More specifically, the first connector 351 is connected to the first light emitting module 211 and the second light emitting module 212 of the first light emitting block 251 through a first wire 310 arranged in the first layer 201.

Also, the second connector 352 is connected to the third light emitting module 213 and the fourth light emitting module 214 of the second light emitting block 253 through a second wire 320, a first via hole 323 and a second via hole 326, which are located in the first layer 201. The first via hole 323 and the second via hole 326 are connected to the second layer 202 and are connected to each other through the second wire 320 which is arranged in the second layer 202. That is, the second wire 320 extends from the second connector 352 to the first via hole 323 along the first layer 201, from the first via hole 323 to the second via hole 326 along the second layer 202, and from the second via hole 326 to each of the third light emitting module 213 and fourth light emitting module 214 along the first layer 201.

Figure 3C:
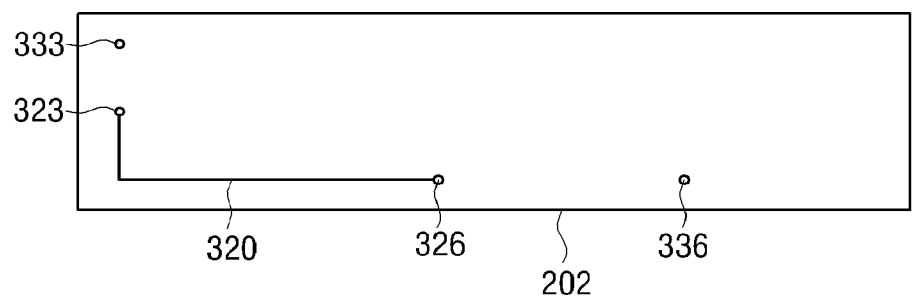
FIG. 3C is a view illustrating the second layer of the three-layered substrate of FIG. 3A.

FIG. 3C is a view illustrating the second layer 202 of the three-layered substrate 200. As shown in FIG. 3C, the first via hole 323 and the second via hole 326 are connected to each other through the second wire 320 arranged in the second layer 202.

Referring back to FIG. 3B, the third connector 353 is connected to the fifth light emitting module 215 and the sixth light emitting module 216 of the third light emitting block 255 through a third wire 330, a third via hole 333 and a fourth via hole 336 which are located in the first layer 201. The third via hole 333 and the fourth via hole 336 are connected to the third layer 203 and are connected to each other through the third wire 330 which is arranged in the third layer 203. That is, the third wire 330 extends from the third connector 353 to the third via hole 333 along the first layer 201, from the third via hole 333 to the fourth via hole 336 along the second layer 202, and from the fourth via hole 336 to each of the fifth light emitting module 215 and sixth light emitting module 216 along the first layer 201.

Figure 3D:
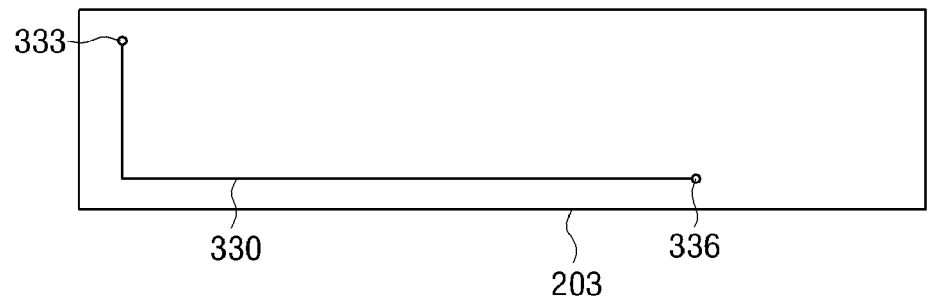
FIG. 3D is a view illustrating the third layer of the three-layered substrate of FIG. 3A.

FIG. 3D is a view illustrating the third layer 203 of the three-layered substrate 200. As shown in FIG. 3D, the third via hole 333 and the fourth via hole 336 are connected to each other through the third wire 330 arranged in the third layer 203.

As described above, the first driving unit 221 is connected to the first light emitting block 251 through the first wire 310 located in the first layer 201, the second driving unit 222 is connected to the second light emitting block 253 through the second wire 320 which is arranged on the first layer 201 and the second layer 202 and connects the first via hole 323 and the second via hole 326 on the second layer 202, and the third driving unit 223 is connected to the third light emitting block 255 through the third wire 330 which is arranged on the first layer 201 and the third layer 203 and connects the third via hole 333 and the fourth via hole 336 on the third layer 203.

The backlight unit 130 including the three light emitting blocks 251, 253, 255 as described above can adjust brightness of the three areas independently, thereby providing local dimming. Use of the three-layered substrate 200 makes it possible to maintain the width of the substrate 200 to be the same as that of a backlight apparatus which does not support local dimming. Accordingly, by using the multi-layered substrate 200, the width of the backlight apparatus 130 which provides local dimming can be reduced.

Figure 3E:
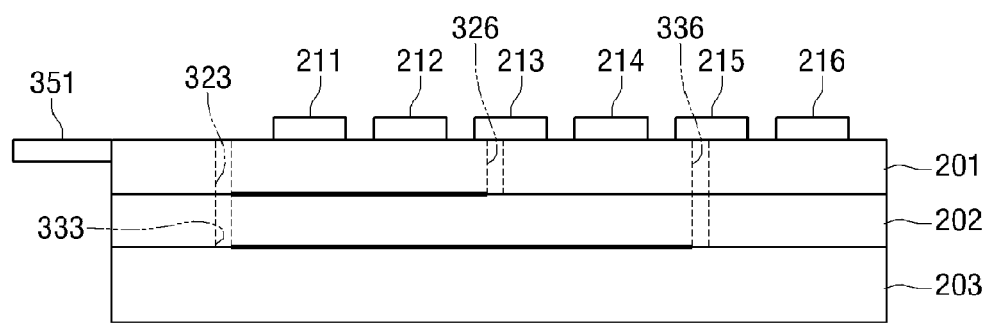
FIG. 3E is a front view illustrating the edge type backlight apparatus using the three-layered substrate when being viewed from a direction "y"
Figure 3F:
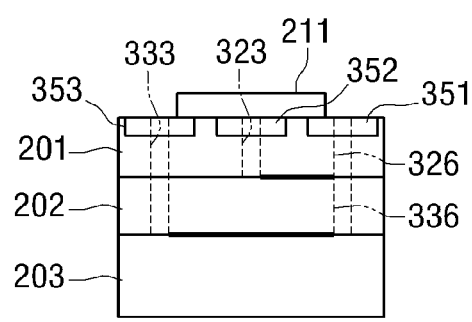
FIG. 3F is a side view illustrating the edge type backlight apparatus using the three-layered substrate when being viewed from a direction "x"

FIG. 3E is a front view illustrating the edge type backlight apparatus using the three-layered substrate of FIG. 3A when being viewed from a direction "y." FIG. 3F is a side view illustrating the edge type backlight apparatus using the three-layered substrate of FIG. 3A when being viewed from a direction "x."

As shown in FIGS. 3E and 3F, the first via hole 323 and the second via hole 326 penetrate through the first layer 201 and connect the top surface of the first layer 201 to the top surface of the second layer 202, and the third via hole 333 and the fourth via hole 336 penetrate through the first layer 201 and the second layer 202 and connect the top surface of the first layer 201 to the top surface of the third layer 203.

FIGS. 3A to 3F illustrate the backlight apparatus 300 which includes the substrate 200 having three layers, the light emitting unit 210 including three (3) light emitting blocks, and the three (3) driving units 220. However, the number of layers of the substrate 200 may be less than the number of light emitting blocks and the number of driving units. This will be explained with reference to FIGS. 4A to 4E.

Hereinafter, a backlight apparatus 130 including a two-layered substrate 200, a light emitting unit 210 including three light emitting blocks, and three driving units 220 will be explained with reference to FIGS. 4A to 4E.

FIG. 4A is a perspective view illustrating an edge type backlight apparatus using a two-layered substrate 200 according to an exemplary embodiment. FIG. 4B is a view illustrating a first layer 201 of the two-layered substrate 200. Since FIGS. 4A to 4E are similar to FIGS. 3A to 3F, an overlapped explanation is omitted.

As shown in FIG. 4A, the backlight apparatus or the backlight unit 130 includes a two-layered substrate 200, a light emitting unit 210 including three light emitting blocks, and three driving units 220.

As shown in FIG. 4B, a first connector 351 is connected to a first light emitting module 211 and a second light emitting module 212 of a first light emitting block 251 through a first wire 310 which is located in the first layer 201.

A second connector 352 is connected to a third light emitting module 213 and a fourth light emitting module 214 of a second light emitting block 253 through a second wire 320, a first via hole 323 and a second via hole 326 which are located in the first layer 201. The first via hole 323 and the second via hole 326 are connected to the second layer 202 and are connected to each other through the second wire 320 arranged in the second layer 202. That is, the second wire 320 extends from the second connector 352 to the first via hole 323 along the first layer 201, from the first via hole 323 to the second via hole 326 along the second layer 202, and from the second via hole 336 to each of the third light emitting module 213 and fourth light emitting module 214 along the first layer 201.

FIG. 4C is a view illustrating a second layer 202 of the two-layered substrate 200. As shown in FIG. 4C, the first via hole 323 and the second via hole 326 are connected to each other through the second wire 320 which is arranged in the second layer 202.

Referring back to FIG. 4B, a third connector 353 is connected to a fifth light emitting module 215 and a sixth light emitting module 216 of a third light emitting block 255 through a third wire 330, a third via hole 333 and a fourth via hole 336 which are located in the first layer 201. The third via hole 333 and the fourth via hole 336 are connected to the second layer 203 and are connected to each other through a third wire 330 which is arranged in the second layer 203. That is, the third wire 330 extends from the third connector 353 to the third via hole 333 along the first layer 201, from the third via hole 333 to the fourth via hole 336 along the second layer 202, and from the fourth via hole 336 to each of the fifth light emitting module 215 and sixth light emitting module 216 along the first layer 201.

As shown in FIG. 4C, the third via hole 333 and the fourth via hole 336 are connected to each other through the third wire 330 arranged in the second layer 203.

As described above, the first driving unit 221 is connected to the first light emitting block 251 through the first wire 310 located in the first layer 201, the second driving unit 222 is connected to the second light emitting block 253 through the second wire 320 which is arranged on the first layer 201 and the second layer 202 and connects the first via hole 323 and the second via hole 326 on the second layer 202, and the third driving unit 223 is connected to the third light emitting block 255 through the third wire 330 which is arranged on the first layer 201 and the second layer 202 and connects the third via hole 333 and the fourth via hole 336 on the second layer 202.

Figure 4D:
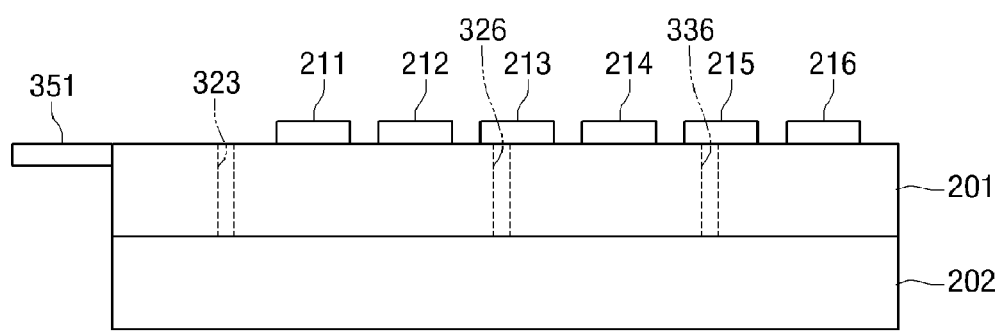
FIG. 4D is a front view illustrating the edge type backlight apparatus using the two-layered substrate when being viewed from a direction "y"
Figure 4E:
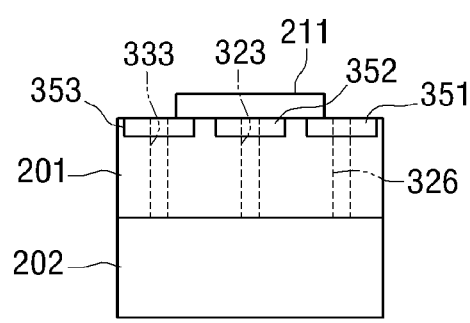
FIG. 4E is a side view illustrating the edge type backlight apparatus using the two-layered substrate when being viewed from a direction "x"

FIG. 4D is a front view illustrating the edge type backlight apparatus using the two-layered substrate shown in FIG. 4A when being viewed from a direction "y." FIG. 4E is a side view illustrating the edge type backlight apparatus using the two-layered substrate shown in FIG. 4A when being viewed from a direction "x.".

As shown in FIGS. 4D and 4E, the first via hole 323 and the second via hole 326 penetrate through the first layer 201 and connect the top surface of the first layer 201 to the top surface of the second layer 202, and the third via hole 333 and the fourth via hole 336 penetrate through the first layer 201 and connect the top surface of the first layer 201 to the top surface of the second layer 202.

As described above, the backlight unit 130 including the three light emitting blocks 251, 253, 255 can adjust brightness of the three areas independently, thereby providing local dimming. Use of the two-layered substrate 200 makes it possible to maintain the width of the substrate 200 the same as that of a backlight apparatus which does not support local dimming. That is, it can bee seen from FIGS. 4A to 4E that the number of layers 201, 202, 203 of the substrate 200 may be less than the number of light emitting modules 251, 253, 255 and the number of driving units 221, 222, 223.

By using the multi-layered substrate 200 described above, the width of the backlight apparatus 130 which supports local dimming can be reduced and accordingly the display apparatus 100 can be slim even if it supports local dimming.

Although the connector 350 is formed as a protrusion from the first layer 201 in FIGS. 3A to 4E, this is merely an example. The connector 350 may be of any shape if it can connect the driving unit 220 and the light emitting blocks 251, 253, 255. For example, the connector 350 may have a shape shown in FIGS. 5A and 5B.

Figure 5A:
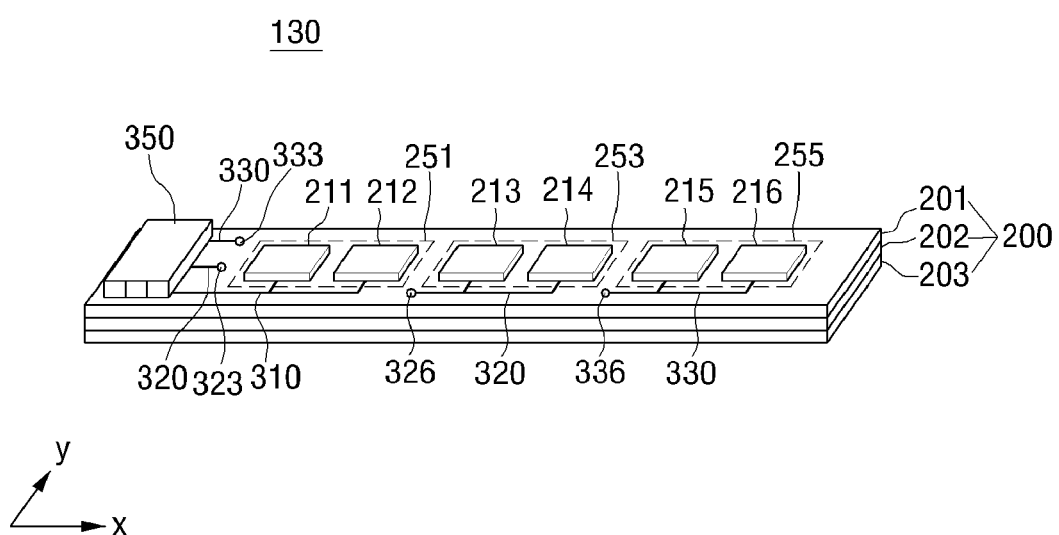
FIGS. 5A and 5B are views illustrating a connector according to an exemplary embodiment.
Figure 5B:
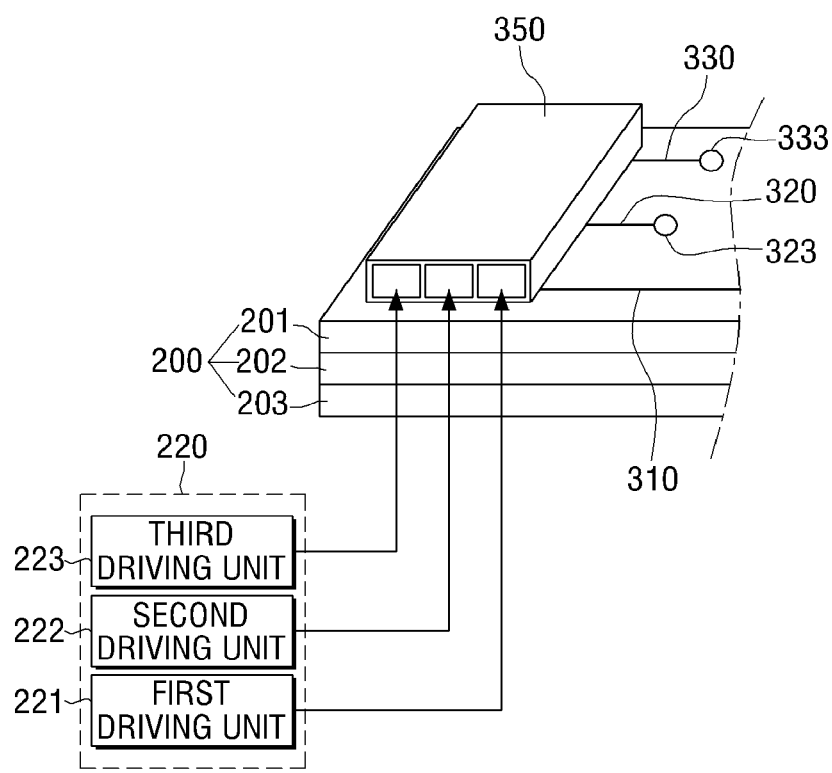

FIGS. 5A and 5B are views illustrating a shape of a connector 350 according to an exemplary embodiment. FIG. 5A is a perspective view illustrating a substrate 200 on which a socket type connector 350 is arranged, and FIG. 5B is an enlarged view of the connector 350 of FIG. 5A.

As shown in FIGS. 5A and 5B, the connector 350 may be of a socket type. A connector (not shown) of a driving unit 220 is inserted into the socket type connector 350 arranged on the substrate 200 such that the driving unit 220 is connected to light emitting blocks 251, 253, 255 through the connector 350.

The connector may have other shapes and is not limited to the configurations of the exemplary embodiments described above.

Also, although the substrate 200 has two or three layers, this is merely an example. The substrate 200 may include any number of layers according to the number of driving units and the number of light emitting blocks.

The display apparatus is an LCD apparatus in the above exemplary embodiments, but this is merely an example. The exemplary embodiments can be applied to any other display apparatus which uses an edge type backlight apparatus.

According to the exemplary embodiments as described above, the backlight apparatus 130 including the substrate 200 which includes the plurality of layers and the light emitting unit 210 arranged on the top layer 201, wherein the plurality of wires 310, 320, 330 to electrically connect the plurality of light emitting modules 211-216 and the plurality of driving units 220 are located in the plurality of layers 201, 202, 203, and the display apparatus 100 including the same are provided. Accordingly, the width of the substrate 200 of the edge type backlight apparatus which provides local dimming can be reduced. Therefore, the display apparatus 100 can be slim even if it has a function of providing local dimming using the edge type backlight apparatus.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A display apparatus, comprising:
   a display panel; and
   a backlight unit configured to provide backlight to the display panel,
   wherein the backlight unit comprises:
   a plurality of light emitting modules;
   at least one driving unit configured to drive the plurality of light emitting modules; and
   a substrate which comprises a plurality of layers stacked together,
   wherein the light emitting modules are mounted on a top layer of the plurality of layers, and a plurality of wires penetrate through the plurality of layers to electrically connect the plurality of light emitting modules and the at least one driving unit.

2. The display apparatus as claimed in claim 1, wherein the backlight unit further comprises a plurality of light emitting blocks each comprising at least one of the plurality of the light emitting modules,
   wherein at least one of the plurality of wires is arranged in each of the plurality of layers of the substrate and connected to at least one of the plurality of light emitting blocks.

3. The display apparatus as claimed in claim 2, wherein all of the light emitting modules included in each one of the light emitting blocks are connected to a same wire.

4. The display apparatus as claimed in claim 2, wherein a number of the layers of the substrate is equal to a number of the light emitting blocks.

5. The display apparatus as claimed in claim 2, wherein a number of the driving units is equal to a number of the light emitting blocks to respectively drive the light emitting blocks.

6. The display apparatus as claimed in claim 2, wherein the plurality of light emitting blocks are driven concurrently by one driving unit.

7. The display apparatus as claimed in claim 1, wherein the backlight unit further comprises a plurality of light emitting blocks each comprising at least one of the plurality of light emitting modules, and wherein a number of the light emitting blocks corresponds to a number of the driving units, and a number of the layers is less than or equal to the number of the driving units.

8. The display apparatus as claimed in claim 1, wherein the plurality of layers of the substrate are connected to each other through at least one via hole.

9. The display apparatus as claimed in claim 5, wherein the plurality of driving units drive the light emitting modules at different brightness levels.

10. The display apparatus as claimed in claim 1, further comprising:

a chassis which accommodates the light emitting modules and the substrate at an end of the display panel.

11. The display apparatus as claimed in claim 10, wherein each of the plurality of light emitting modules includes at least one light emitting diode, and the light emitting modules are disposed along an edge of the chassis at the end of the display panel.

12. A backlight apparatus comprising:

a plurality of light emitting modules;

at least one driving unit which independently drives the plurality of light emitting modules; and a substrate which comprises a plurality of layers stacked together, wherein the light emitting modules are mounted on a top layer of the plurality of layers, and a plurality of wires penetrate through the plurality of layers to electrically connect the plurality of light emitting modules and the at least one driving unit.

13. The backlight apparatus as claimed in claim 12, further comprising a plurality of light emitting blocks each comprising at least one of the plurality of light emitting modules, wherein at least one wire is arranged in each of the plurality of layers of the substrate and connected to at least one of the plurality of light emitting blocks.

14. The backlight apparatus as claimed in claim 13, wherein all of the light emitting modules included in each one of the light emitting blocks are connected to a same wire.

15. The backlight apparatus as claimed in claim 13, wherein a number of the layers of the substrate is equal to a number of the light emitting blocks.

16. The backlight apparatus as claimed in claim 13, wherein a number of the driving units is equal to a number of the light emitting blocks to respectively drive the light emitting blocks.

17. The backlight apparatus as claimed in claim 13, wherein the plurality of light emitting blocks are driven concurrently by one driving unit.

18. The backlight apparatus as claimed in claim 12, further comprising a plurality of light emitting blocks each comprising at least one of the plurality of light emitting modules, wherein a number of the light emitting blocks corresponds to a number of the driving units, and a number of the layers is less than or equal to the number of the driving units.

19. The backlight apparatus as claimed in claim 12, wherein the plurality of layers of the substrate are connected to each other through at least one via hole.

20. The backlight apparatus as claimed in claim 16, wherein the plurality of driving units drive the light emitting modules at different brightness levels.

21. The backlight apparatus as claimed in claim 12 further comprising:

a chassis which accommodates the light emitting modules and the substrate at an end of a display panel.

22. The backlight apparatus as claimed in claim 21, wherein each of the plurality of light emitting modules includes at least one light emitting diode, and the light emitting modules are disposed along an edge of the chassis.

\* \* \* \* \*